(12) United States Patent
Liang

(10) Patent No.: US 7,948,183 B2
(45) Date of Patent: May 24, 2011

(54) THREE-DIMENSIONAL MINIATURIZED POWER SUPPLY

(75) Inventor: Chien-Kuo Liang, Chung-Ho (TW)

(73) Assignee: Aeon Lighting Technology Inc., Taipei (TW)

( * ) Notice: Subject to any disclaimer, the term of this patent is extended or adjusted under 35 U.S.C. 154(b) by 0 days.

(21) Appl. No.: 12/004,486

(22) Filed: Dec. 21, 2007

(65) Prior Publication Data
US 2010/0207526 A1 Aug. 19, 2010

(30) Foreign Application Priority Data
Dec. 3, 2007 (TW) ................................ 96145866 A

(51) Int. Cl.
*H01J 7/44* (2006.01)

(52) U.S. Cl. ............ 315/51; 315/71; 362/294; 362/265; 362/545

(58) Field of Classification Search .................. 336/200, 336/223, 232; 362/227, 294, 543–545, 800, 362/265; 363/131; 315/51, 71
See application file for complete search history.

(56) References Cited

U.S. PATENT DOCUMENTS

| 6,449,178 | B1 * | 9/2002 | Sakai et al. ................... 363/131 |
| 7,132,921 | B2 * | 11/2006 | Eguchi et al. ................. 336/200 |
| 7,703,951 | B2 * | 4/2010 | Piepgras et al. .............. 362/373 |
| 7,766,518 | B2 * | 8/2010 | Piepgras et al. .............. 362/373 |
| 2009/0079321 | A1 * | 3/2009 | Liang ............................. 313/323 |

* cited by examiner

*Primary Examiner* — Haissa Philogene
(74) *Attorney, Agent, or Firm* — Jackson IPG PLLC; Demian K. Jackson

(57) ABSTRACT

A three-dimensional miniaturized power supply is composed of at least two of a first circuit board and a second circuit board which are assembled in a chamber of a container in a three-dimensional spatial form, wherein an insulation spacing, which is in compliance with an ITE safety regulation, is provided between a circuit of the first circuit board and a circuit of the second circuit board, allowing an area and a volume of the power supply to be miniaturized, such that the power supply can be emplaced in a small container.

11 Claims, 13 Drawing Sheets

THREE-DIMENSIONAL MINIATURIZED POWER SUPPLY

BACKGROUND OF THE INVENTION a) Field of the Invention

The present invention relates to a three-dimensional miniaturized power supply, and more particularly to a power supply wherein a primary side circuit is installed on an independent circuit board, a secondary side circuit is installed on another independent circuit board, and the two circuit boards are assembled in a three-dimensional form, such that an entire volume of the circuit boards after being assembled can be diminished to be emplaced in a chamber of a container; and at a same time, a space which is in compliance with an ITE (Information Technology Equipment) insulation spacing regulation is provided between the primary side circuit and the secondary side circuit.

b) Description of the Prior Art

A circuit board A of a conventional power supply is shown in FIG. 13, wherein the circuit board A can be in a rectangular or a round shape, with its dangerous low voltage primary side circuit B and a safe low voltage secondary side circuit C for processing an AC power being constructed respectively on a surface of the circuit board A. An insulation spacing L is provided between the dangerous low voltage primary side circuit B and the safe low voltage secondary side circuit C to be in compliance with a safety regulation of an ITE product. The regulation includes tests for danger of an electric shock, danger of energy, danger of a fire, mechanical danger, radiation danger, and chemical danger. As the dangerous low voltage primary side circuit B along with its electronic elements, and the safe low voltage secondary side circuit C along with its electronic elements are all constructed on the surface of the single circuit board A, the area and a volume of the circuit board A will be large and therefore, it will be difficult to emplace the circuit board A of that power supply into a container with a smaller space.

Accordingly, how to miniaturize the power supply to emplace its circuit board into the container with the limited space is an issue to be resolved by the present invention.

SUMMARY OF THE INVENTION

The primary object of the present invention is to provide a three-dimensional miniaturized power supply such that by constructing at least two independent circuit boards in a three-dimensional spatial form, an area and a volume of the power supply can be miniaturized that it can be emplaced in a container at a bottom end of an LED illumination module.

Another object of the present invention is to provide a three-dimensional miniaturized power supply with two or more primary/second circuit boards, wherein an insulation spacing which is in compliance with a safety regulation of an ITE product is provided between circuits of at least two independent circuit boards.

To enable a further understanding of the said objectives and the technological methods of the invention herein, the brief description of the drawings below is followed by the detailed description of the preferred embodiments.

DETAILED DESCRIPTION OF THE PREFERRED EMBODIMENTS

Figure 1:
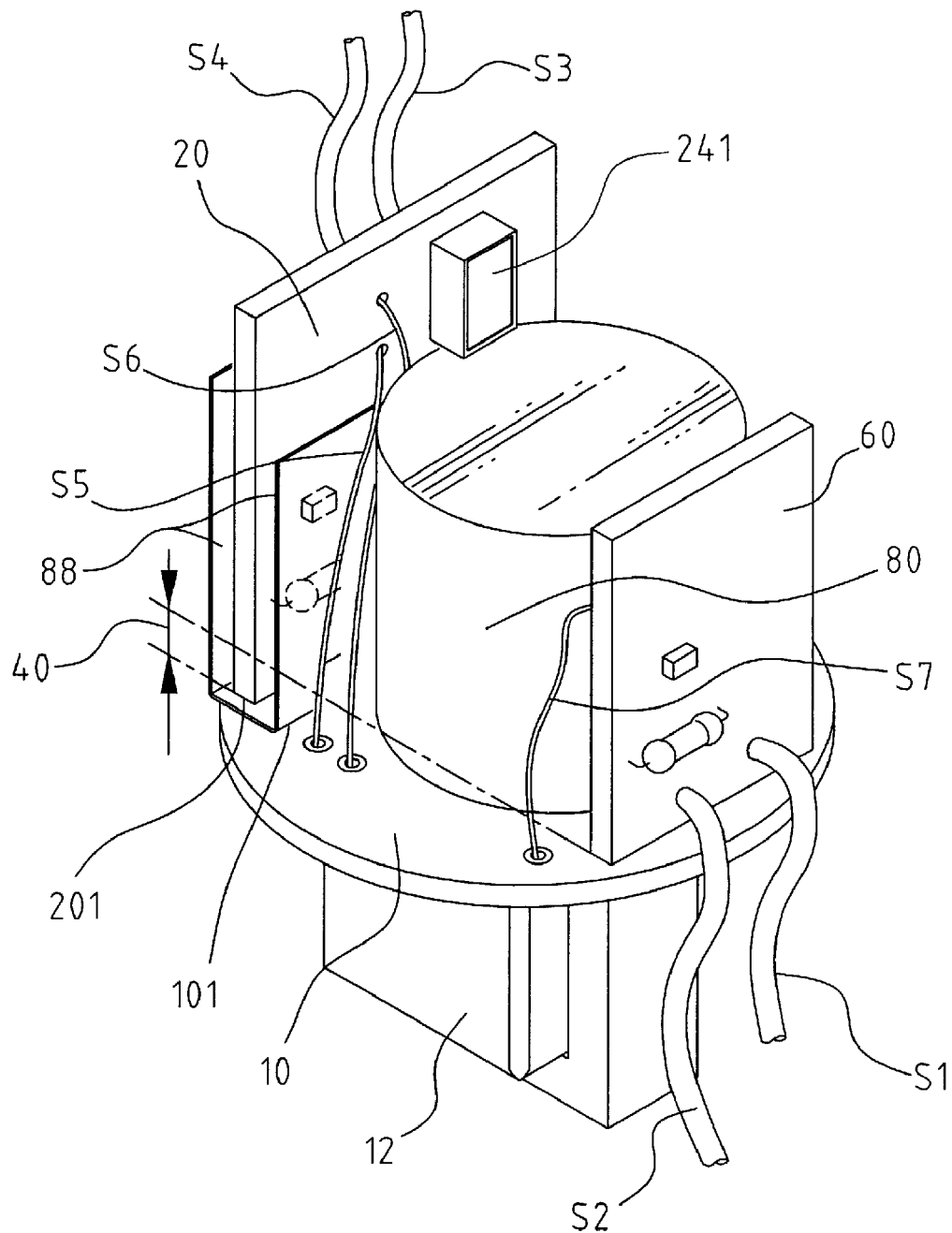
FIG. 1 shows a perspective view of three-dimensional circuit boards of the present invention after being assembled.
Figure 2:
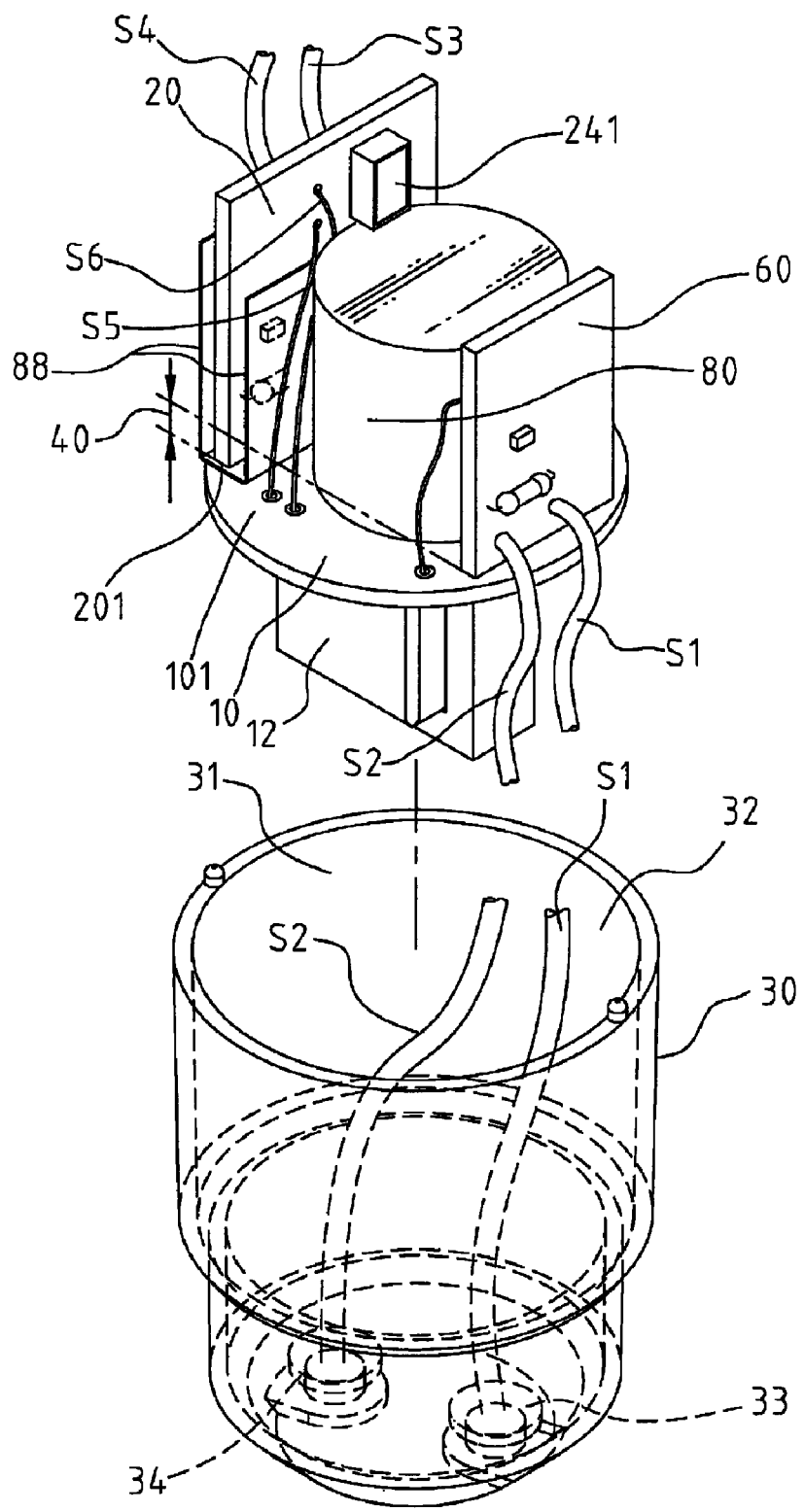
FIG. 2 shows an exploded view of three-dimensional circuit boards and a container of the present invention.
Figure 9:
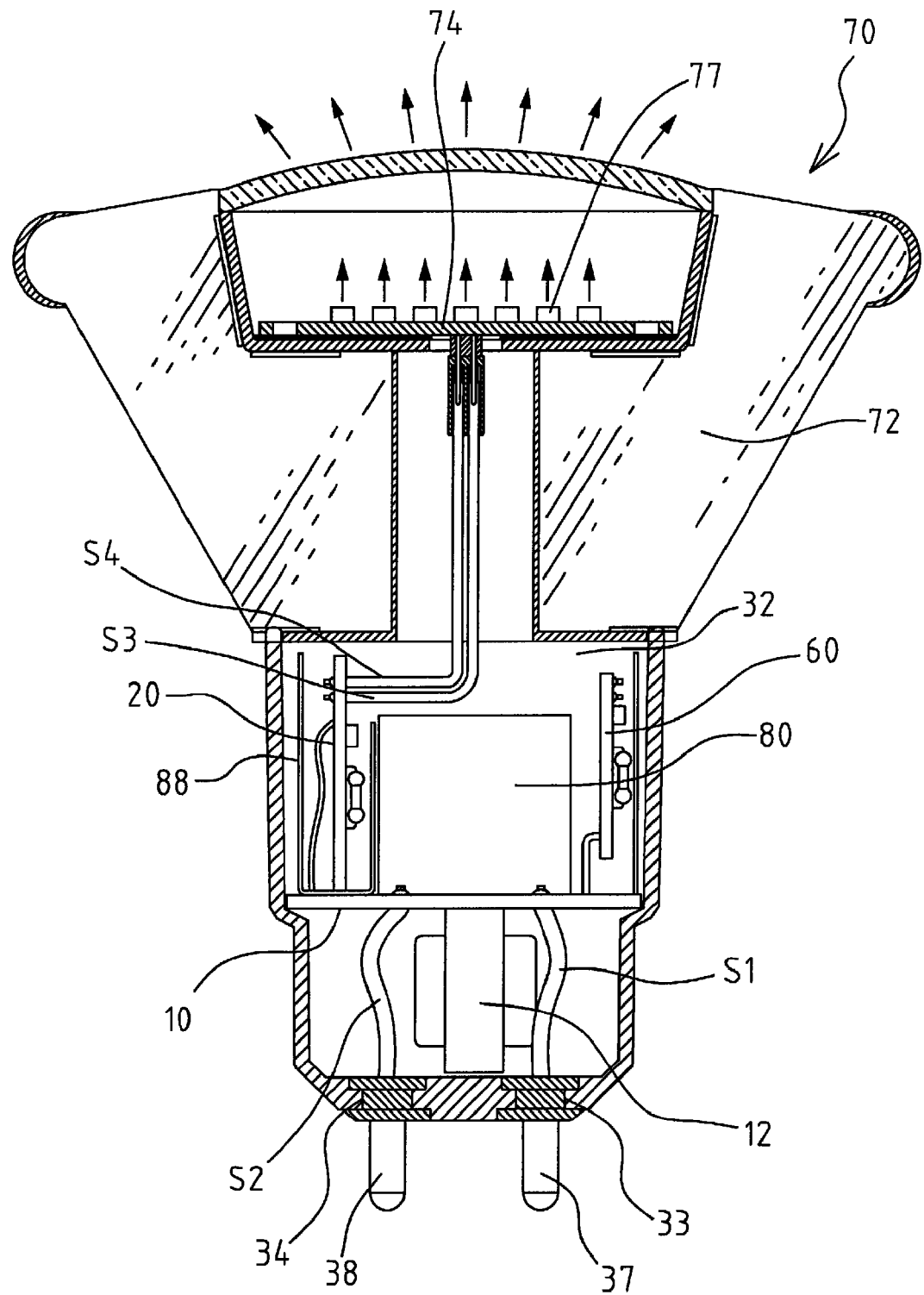
FIG. 9 shows a cross sectional view of the present invention when being applied to an LED illumination module.

Referring to FIG. 1, the present invention includes at least two of a first circuit board 10 and a second circuit board 20 which are assembled in a three-dimensional spatial form in a chamber 32 of a container 30 at a bottom end of an LED illumination module 70 (as shown in FIG. 2 and FIG. 9), wherein an insulation gap of spacing 40 which is in compliance with the safety regulation of the ITE product is provided between a primary side circuit on the first circuit board 10 and a secondary side circuit on the second circuit board 20.

Figure 12:
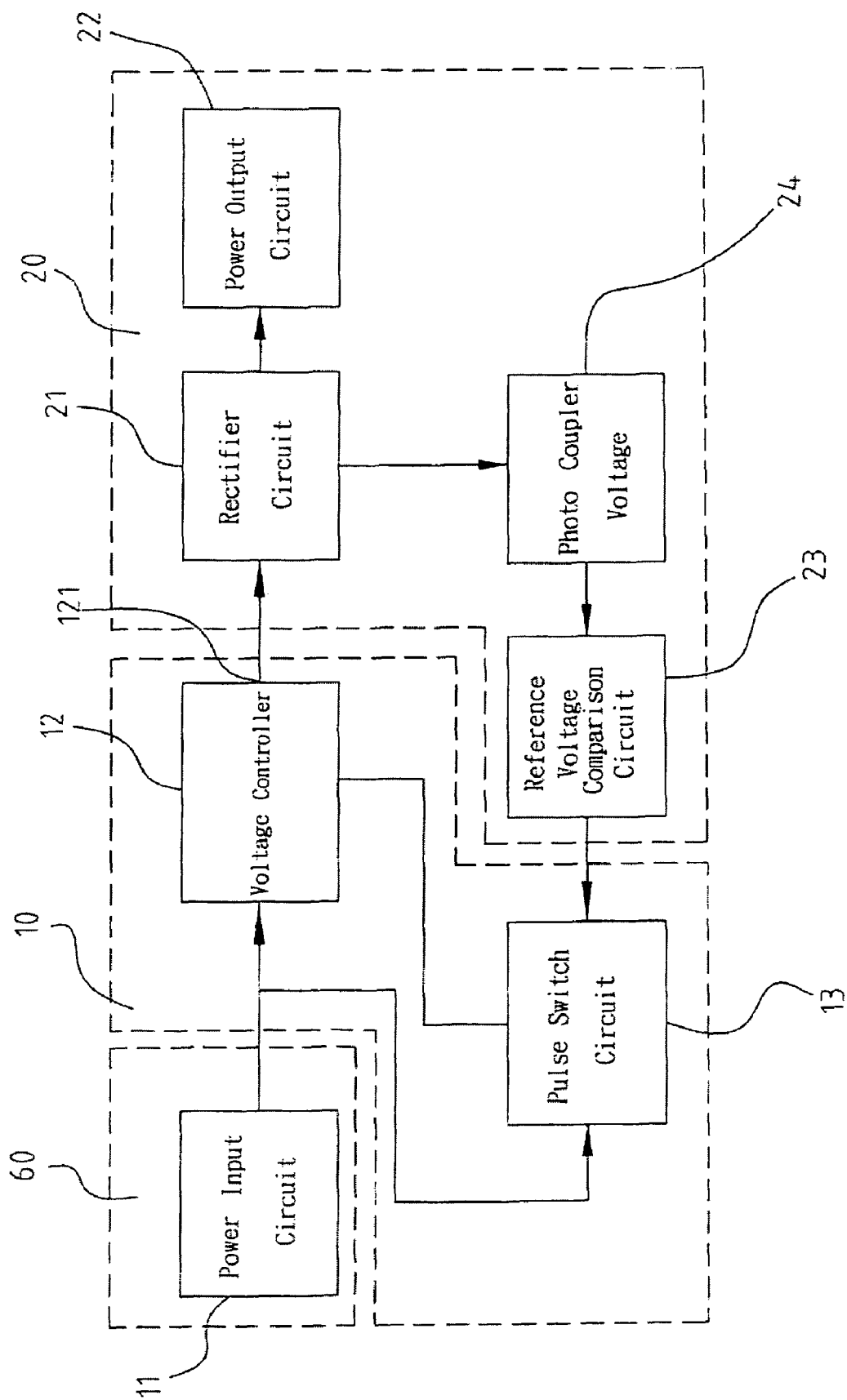
FIG. 12 shows a circuit diagram of an implementation of three circuit boards of the present invention.
Figure 13:
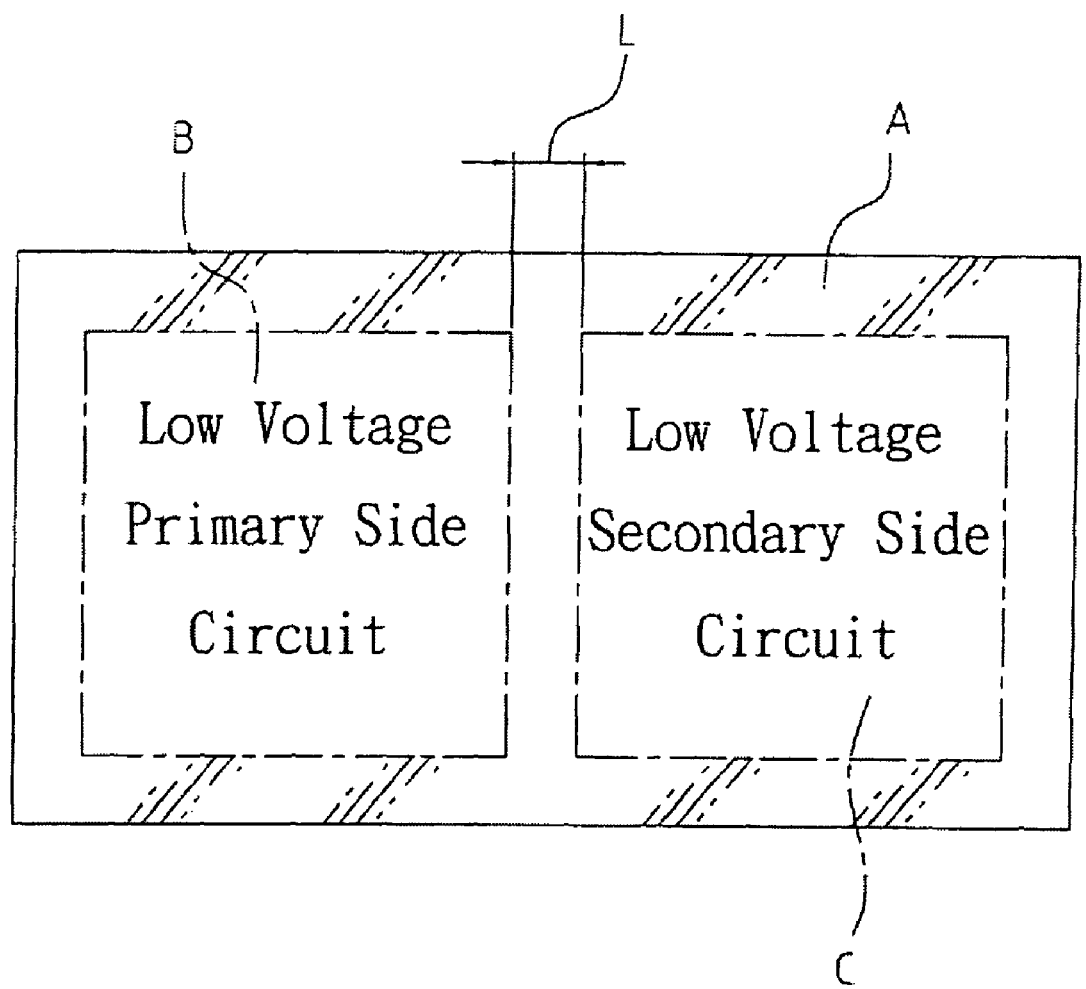
FIG. 13 shows a plan view of a circuit board of a conventional power supply.

Referring to FIG. 12, the first circuit board 10 is configured as a primary side circuit board which includes a power input circuit 11, a voltage controller 12, and a pulse switch circuit 13; and the second circuit board 20 is configured as a safe low voltage secondary side circuit board which includes a rectifier circuit 21, a power output circuit 22, a photo coupler circuit 24, and a reference voltage comparison circuit 23.

An output end of the photo coupler circuit 24 is connected with the pulse switch circuit 13, and an output end 121 of the voltage controller 12 is connected at the rectifier circuit 21.

The first circuit board 10 can be also optionally designed as the secondary side circuit, whereas the second circuit board 20 can be optionally configured as the primary side circuit.

Figure 6:
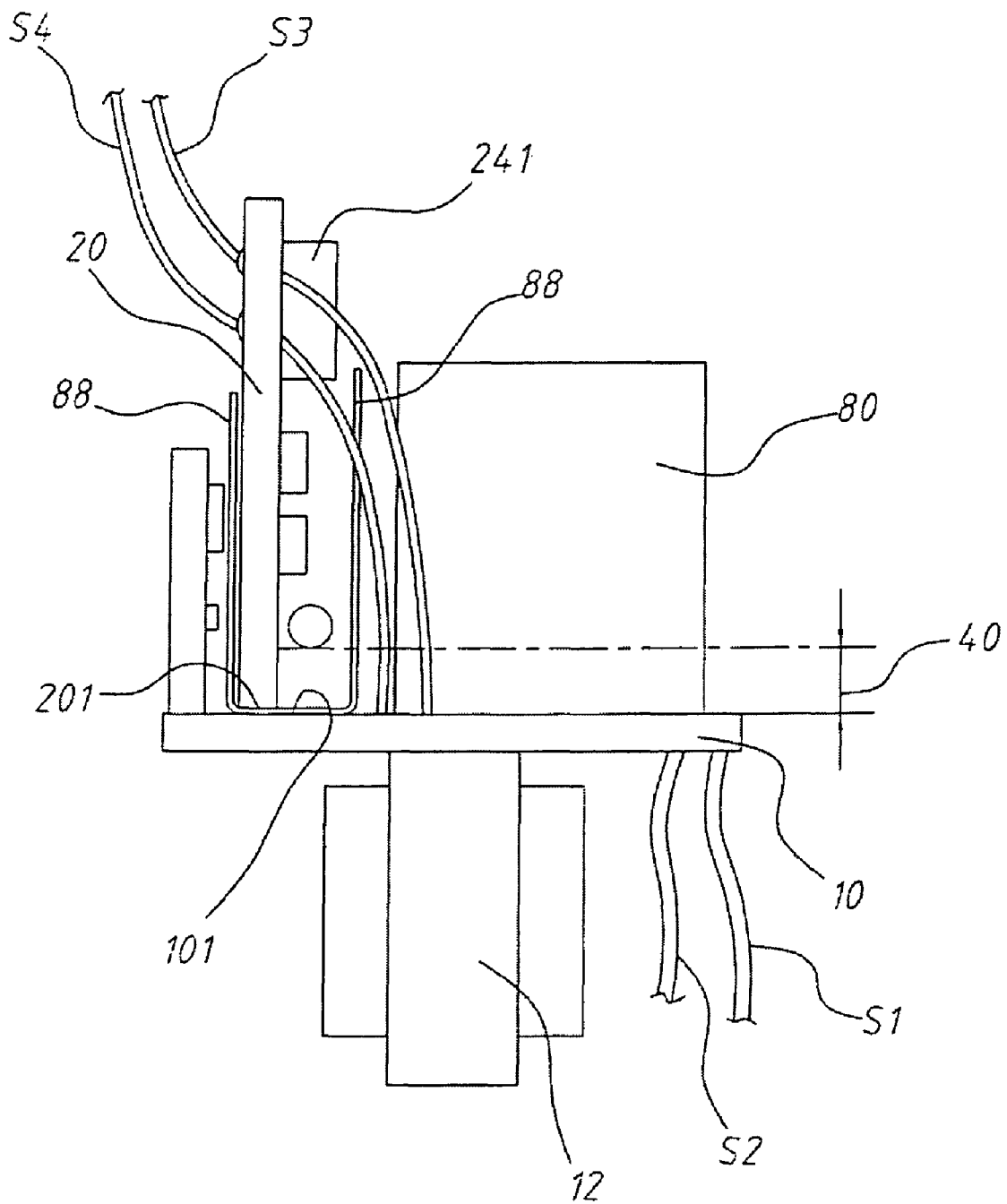
FIG. 6 shows a side view of FIG. 5.

Referring to FIG. 1 and FIG. 6, a bottom end 201 of the second circuit board 20 is connected on a surface 101 of the first circuit board 10, and the insulation gap of spacing 40 of at least 6.4mm is provided between the primary side and secondary side circuits.

Figure 7:
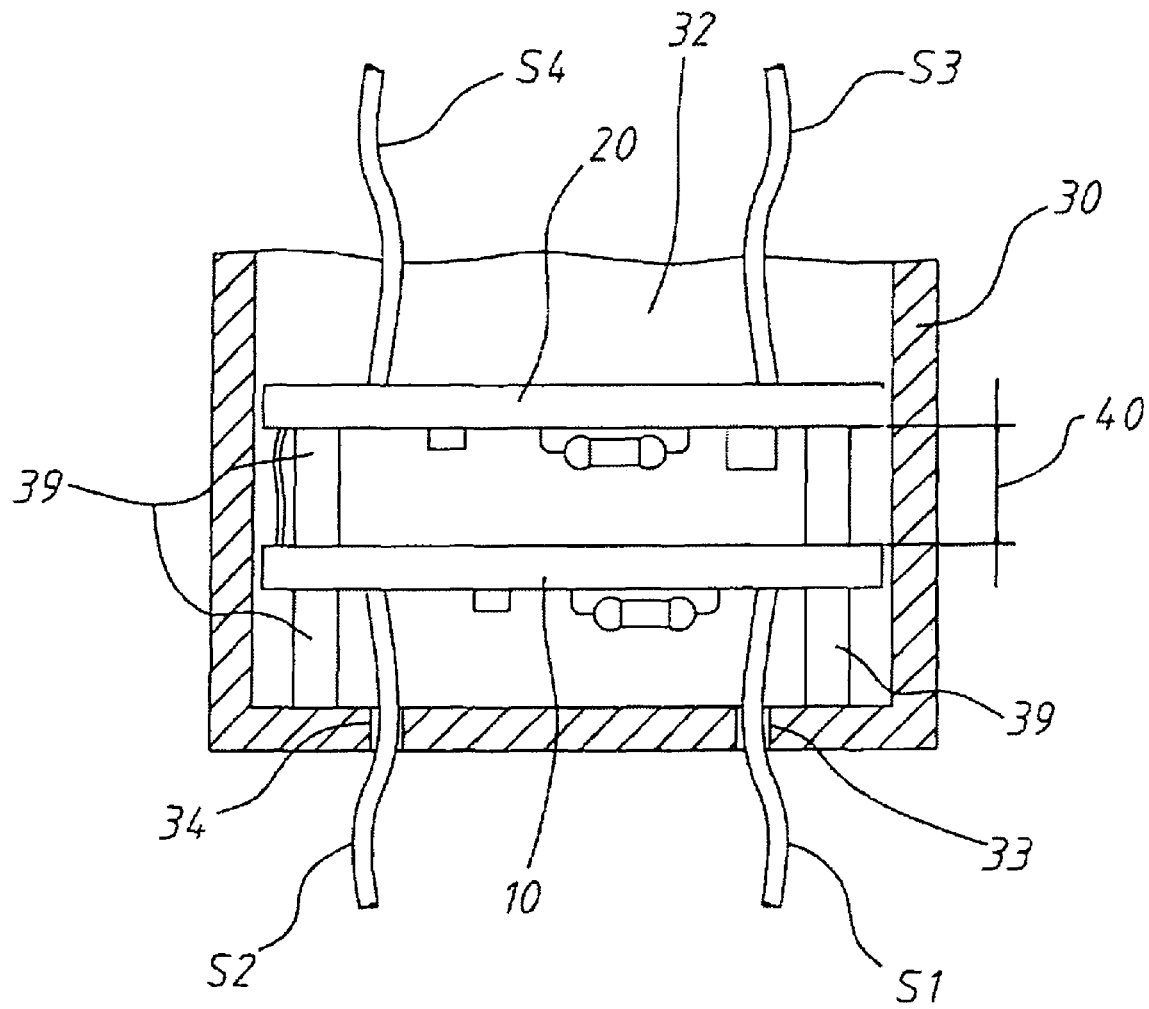
FIG. 7 shows a cross sectional view of two circuit boards which are parallel assembled in a container, according to the present invention.

Referring to FIG. 7, through vertically installing an insulation fixing rack 39 in the chamber 32 of the container 30, more than two of the first and second circuit boards 10, 20 are parallel connected in the chamber 32, and with an insulation gap of spacing 40 provided, which is in compliance with the ITE safety regulation to be configured as at least 6.4 mm, is provided between the first and second circuit boards 10, 20.

Figure 4:
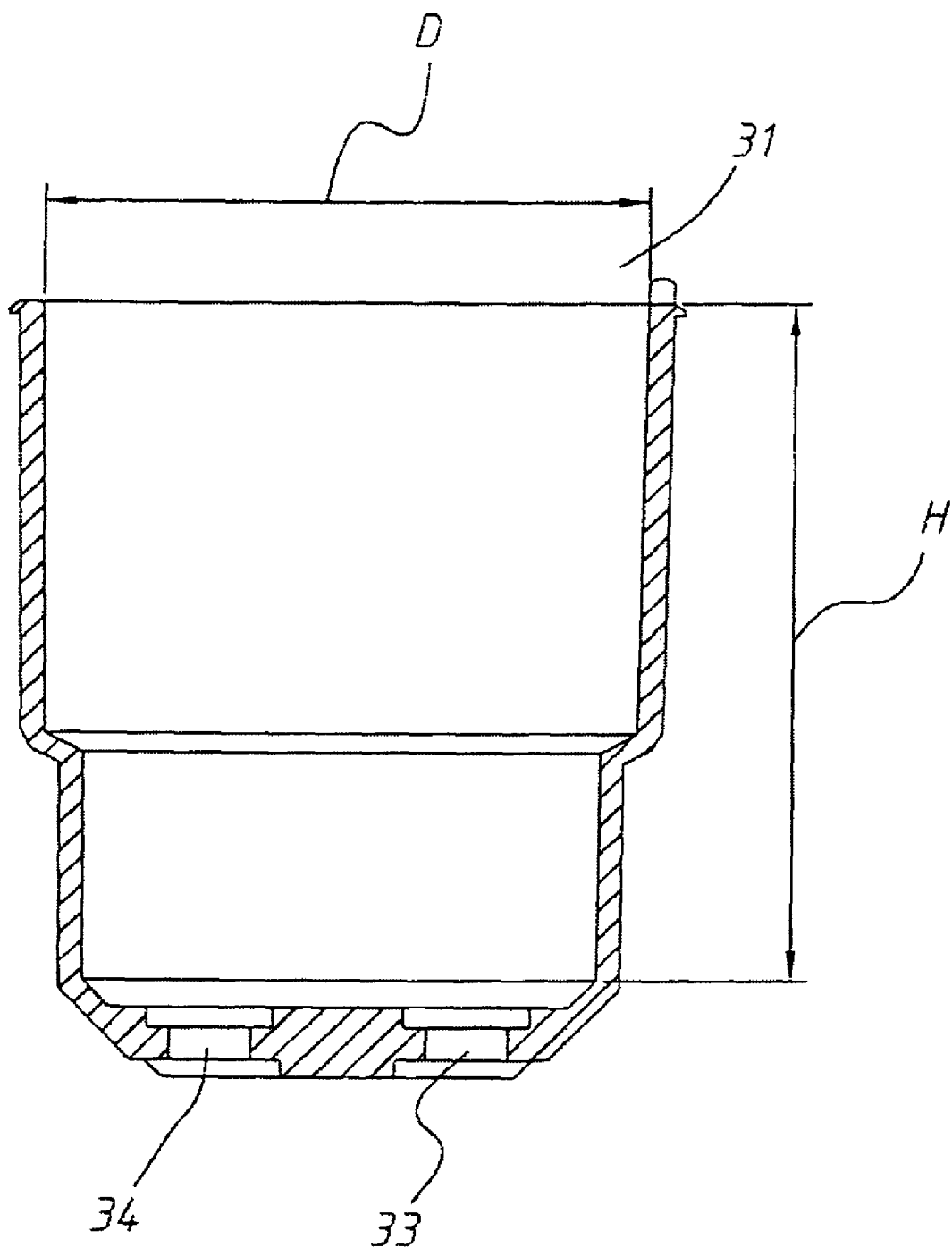
FIG. 4 shows a cross sectional view of a container of the present invention.

Referring to FIG. 2 and FIG. 4, the container 30 is provided with the chamber 32 within which are disposed with two through-holes 33, 34. The first, second, and a third circuit boards of 10, 20, 60 are emplaced in the chamber 32, wherein a surface of the horizontal first circuit board 10 is installed respectively with the second circuit board 20 and the third circuit board 60 in a parallel format, and lower wires S1, S2 of the third circuit board 60 are penetrated out of the through-holes 33, 34 respectively, to serve as input wires of an AC power.

Upper wires S3, S4 of the second circuit board 20 are extended out of a mouth 31 above the chamber 32 respectively, to serve as output wires of the power.

Referring to FIG. 4, the container 30 is provided with the chamber 32, a height H of the chamber 32 is between 18 mm and 58 mm, and a minimum inner diameter D of the chamber 32 is between 12 mm and 50.8 mm.

Figure 5:
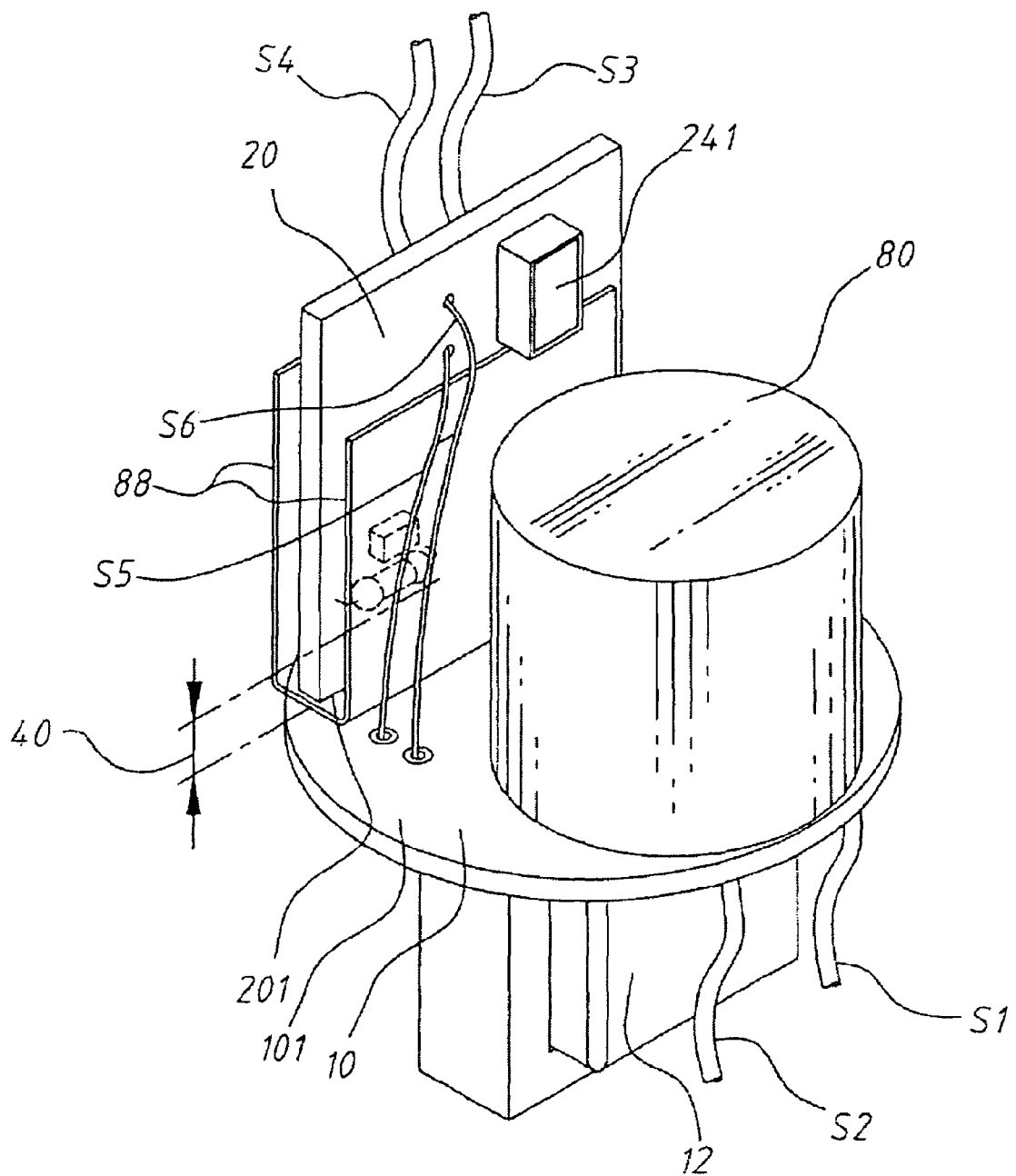
FIG. 5 shows a perspective view of three-dimensional circuit boards assembled by two circuit boards, according to the present invention.

Referring to FIG. 5 and FIG. 6, at least one insulation sheet 88 is located in a space between the first and second circuit boards 10, 20.

Figure 8:
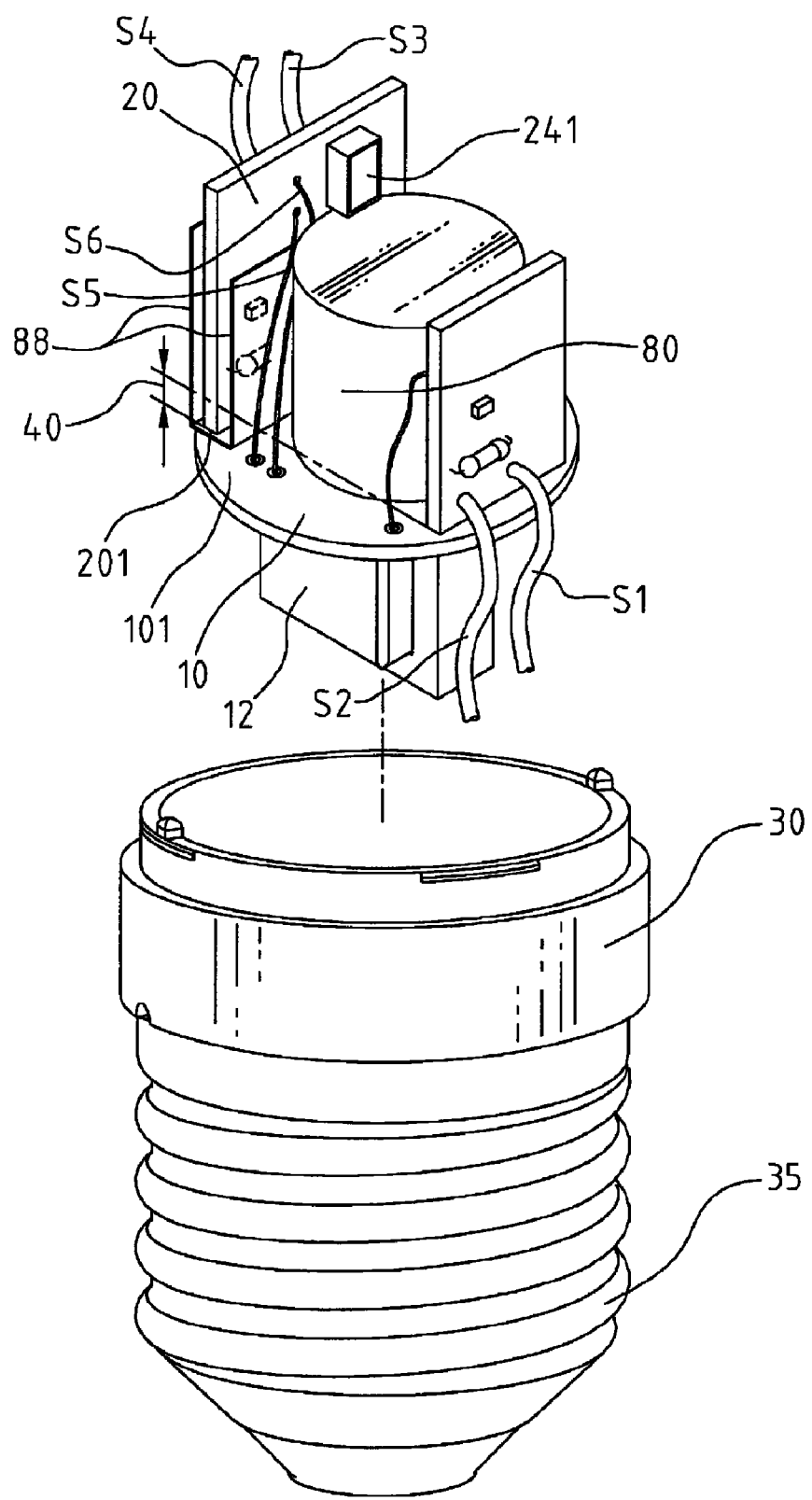
FIG. 8 shows an exploded view of three-dimensional circuit boards and a spiral-shape container, according to the present invention.

Referring to FIG. 8, a bottom end of the container 30 can be provided with a spiral-shape power connector 35.

Figure 3:
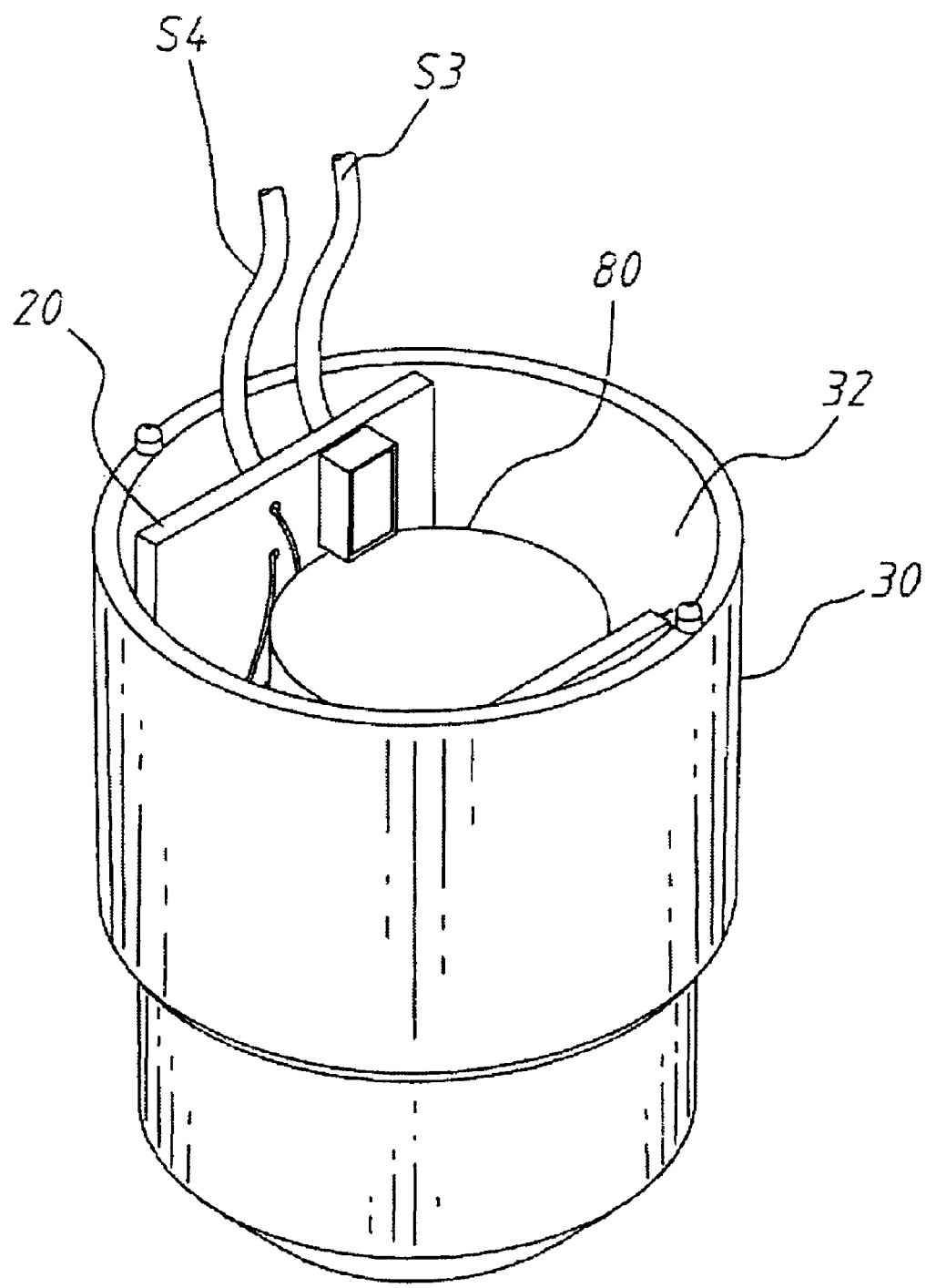
FIG. 3 shows a perspective view of three-dimensional circuit boards which are assembled into a container, according to the present invention.

Referring to FIGS. 1 to 3, in addition to the first circuit board 10 and the second circuit board 20, the third circuit board 60 is added, allowing the first circuit board 10, the second circuit board 20, and the third circuit board 60 to be assembled three-dimensionally in the chamber 32 of the container 30 at the bottom end of the LED illumination module 70 as shown in FIG. 9, wherein the insulation gap of spacing 40, which is in compliance with the ITE safety regulation, is provided between the circuit of the first circuit board 10 and the circuit of the second circuit board 20.

Figure 10:
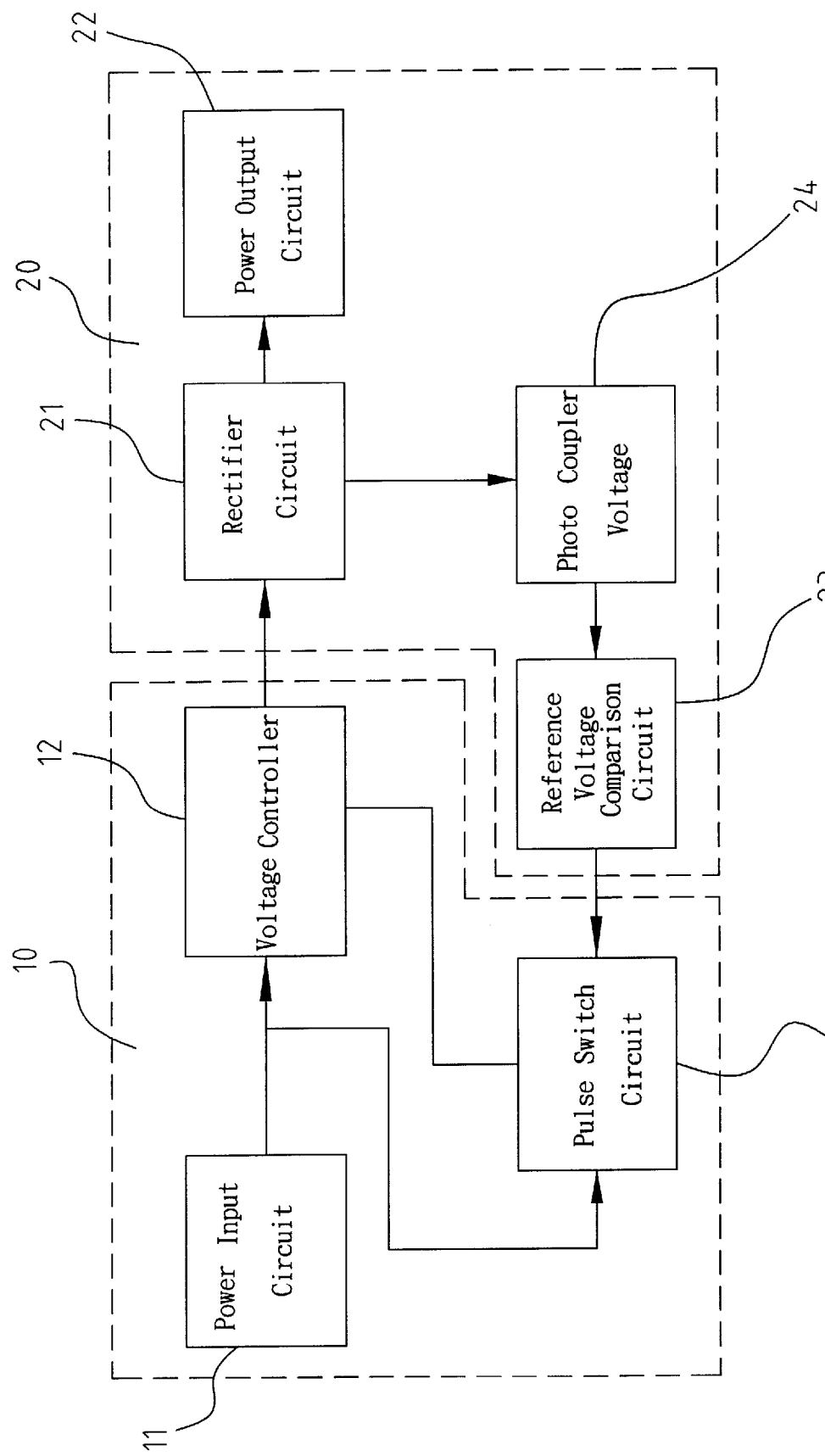
FIG. 10 shows a circuit diagram of an implementation of two circuit boards of the present invention.
Figure 11:
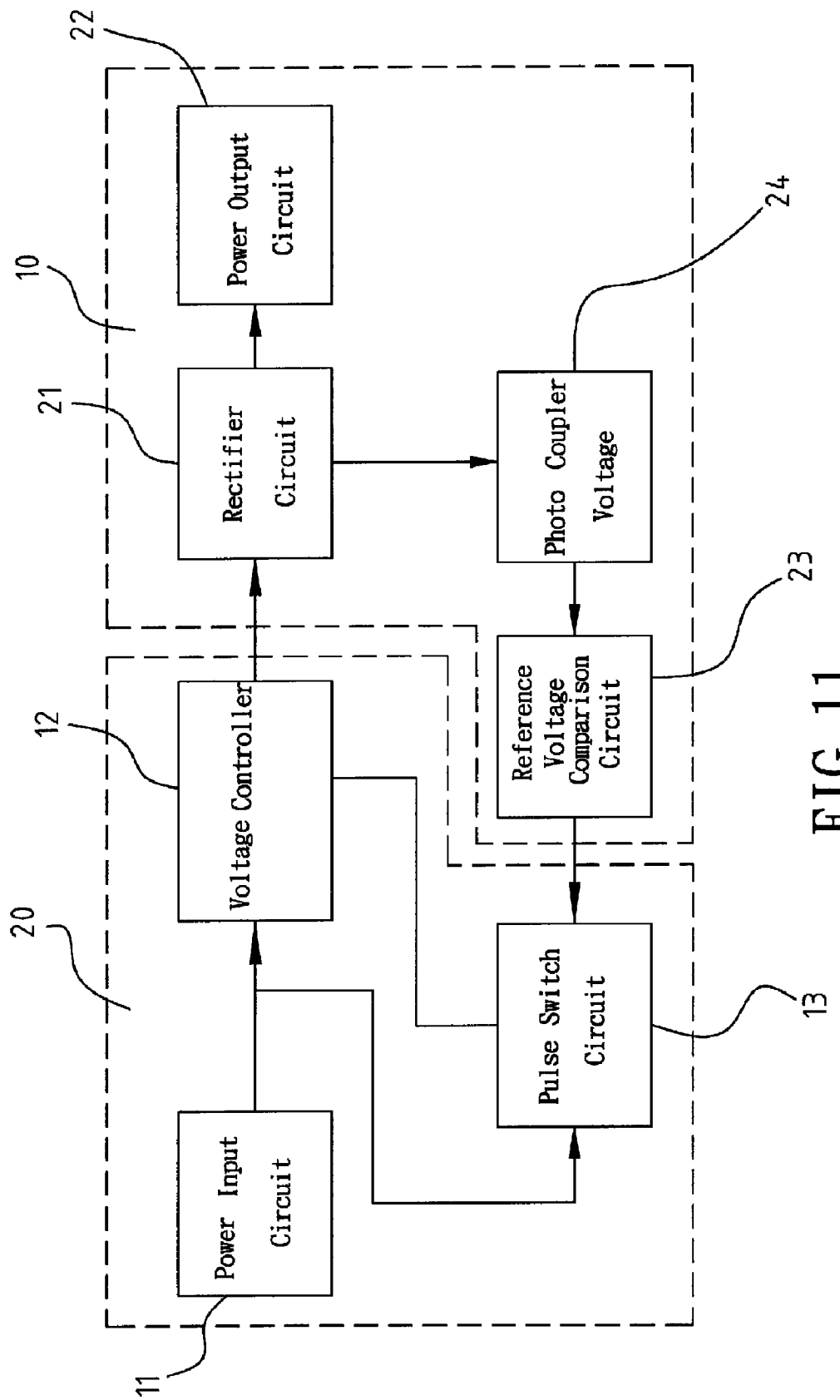
FIG. 11 shows a circuit diagram of another embodiment of two circuit boards of the present invention.

Referring to FIGS. 1 to 3, the first circuit board 10 is a primary side circuit board, and its surface is provided respectively with the voltage controller 12 and the pulse switch circuit 13 (as shown in FIG. 10); the second circuit board 20 is a secondary side circuit board, and its surface is provided with the rectifier circuit 21 (as shown in FIG. 10); whereas, a surface of the third circuit board 60 is provided with the power input circuit 11 (as shown in FIG. 12).

Referring to FIGS. 1 to 3, the container 30 is provided with the chamber 32 within which are disposed with two through-holes 33, 34, the lower wires S1, S2 of the first circuit board 10 are wired out of the through-holes 33, 34 respectively, to serve as the input wires of the AC power, the two wires S3, S4 of the second circuit board 20 are extended out of the mouth 31 above the chamber 32 respectively, to serve as the input wires of the power, and the two wires S1, S2 that are connected to an input end of the third circuit board 60 are penetrated out of the through-holes 33, 34 of the chamber 32 respectively, to serve as power input wires.

Referring to FIG. 5 and FIG. 10, the first circuit board 10 is constructed respectively with the power input circuit 11, the voltage controller 12, and the pulse switch circuit 13, wherein a capacitor 80 is welded on a surface of the first circuit board 10 for rectifying, the first circuit board 10 is the primary side circuit board, and the AC power passes through the lower wires S1, S2, and is transmitted to the power input circuit 11 to provide a power to the pulse switch circuit 13 and the voltage controller 12 for outputting a lower safe voltage.

The second circuit board 20 is constructed respectively with the rectifier circuit 21, the photo coupler circuit 24 and the power output circuit 22. The lower voltage which is outputted from the voltage controller 12 of the first circuit board 10 is transmitted to the rectifier circuit 21 of the second circuit board 20, through a wire S5 as shown in FIG. 5, to rectify into a DC power which serves as a power and a reference voltage for the reference voltage comparison circuit 23. In a mean time, the DC power is also outputted to the power output circuit 22 which outputs a stable power through the wires S3, S4 on FIG. 5 to an ambient electric product.

An output end of the reference voltage comparison circuit 23 on the second circuit board 20 is connected with the pulse switch circuit 13 (as shown in FIG. 10) of the first circuit board 10 through a wire S6 (as shown in FIG. 5), to serve as a buffer between high and low voltages, thereby assuring a safety of the circuit. The photo coupler circuit 24 is used to control the voltage controller 12 to acquire a stable power, such that a safe and stable DC power can be provided to the power output end for use.

The aforementioned control circuits and electronic elements of the power supply are constructed respectively on the circuit boards that are assembled three-dimensionally, as shown in FIG. 5 and FIG. 6, wherein the first circuit board 10 is installed horizontally, the second circuit board 20 is installed on the first circuit board 10 vertically or in a slant manner, with the bottom end 201 of the second circuit board 20 being extended upward to form the insulation gap of spacing 40 of at least 6.4 mm between the first circuit board 10, so as to be in compliance with the ITE safety regulation.

The capacitor 80 is welded on a top surface of the first circuit board 10, and the voltage controller 12 is welded on a bottom surface of the first circuit board 10, further allowing the first circuit board 10 and the second circuit board 20 to form a three-dimensional miniaturized arrangement, thereby improving the shortcoming of the prior art that a large area is taken by an entire circuit board.

Referring to FIG. 1, the power input circuit 11 (as shown in FIG. 12) in the first circuit board 10 is further installed on the third circuit board 60 independently, and the second circuit board 20 can be installed on a top surface at a side of the first circuit board 10 (as shown in FIG. 1), and is connected on the first circuit board 10 through a wire S7; therefore, an entire area of the first circuit board 10 can be even smaller. A surface of the third circuit board 60 is connected with the lower wires S1, S2 through which the AC power passes and is supplied into the power input circuit 11 in the third circuit board 60 for processing (as shown in FIG. 12), with a same circuit principle as the aforementioned. The second circuit board 20 is constructed vertically at a side of the horizontal first circuit board 10. The capacitor 80 is welded on a central surface of the first circuit board 10, and the voltage controller 12 is welded on a bottom surface of the first circuit board 10, wherein the insulation spacing 40, which is in compliance with the ITE safety regulation, is provided between the surface of the second circuit board 20 and the surface of the first circuit board 10, and surfaces of the lower wires S1, S2, the wires S5, S6, and the upper wires S3, S4 are all wrapped by insulative sheaths.

Referring to FIG. 2, the assembly of the first, second, third circuit boards 10, 20, 60, the capacitor 80, and the voltage controller 12, allows the circuit area of the original first circuit board 10 to be further diminished, and at a same time, constitutes a three-dimensional spatial form of assembly.

Referring to FIG. 4, the container 30, above which is the opened mouth 31, is provided with the chamber 32 within which are disposed with two through-holes 33, 34, wherein the height H of the chamber 32 is between 18 mm and 58 mm, and the minimum inner diameter D is between 12 mm and 50.8 mm; therefore, an outer circumference of the first circuit board 10 of this three-dimensional assembly can be exactly latched into the chamber 32. In addition, the second, third circuit boards 20, 60, the capacitor 80, and the voltage controller 12 can be emplaced in the chamber 32 (as shown in FIG. 3). Furthermore, the wires S1, S2 are penetrated out of the two through-holes 33, 34 (as shown in FIG. 9), and are further connected with the AC power; whereas, the upper wires S3, S4 of the second circuit board 20 can be connected to an electric appliance.

Referring to FIG. 9, a bottom end of the LED illumination module 70 is connected with a small container 30, the top rim of container 30 is connected to be the bottom rim of a cooling fin 72. The upper wires S3, S4 are connected on an LED circuit board 74, bottom ends of the lower wires S1, S2 are penetrated into the through-holes 33, 34, and are connected with metallic pins 37, 38, to serve as an AC power plug. The upper wires S3, S4, on the other hand, provide the stable DC power to the LED circuit board 74, allowing LED chips 77 to illuminate.

The three-dimensional assembly of more than two circuit boards of the present invention can largely reduce the circuit area of the conventional power supply, to cope with the miniaturized container 30. On the other hand, it is worthy of mentioning that the space between the first and second circuit boards 10, 20 is provided with a U-shape insulation sheet 88 which is used to prevent electronic elements between the first and second circuit boards 10, 20 from being contacted electrically.

It is also worthy to be mentioned that the first circuit board 10 is not limited to be designed as the primary side circuit board, and it can be also optionally defined as the secondary side circuit board; whereas, the second circuit board 20 is not limited to be designed as the secondary side circuit board, and it can be also optionally defined as the primary side circuit board. The second circuit board 20 is constructed respectively with the power input circuit 11, the voltage controller 12, and the pulse switch circuit 13, to serve as the primary side circuit. In addition, the first circuit board 10 is constructed respectively with the rectifier circuit 21, the power output circuit 22, the photo coupler circuit 23, and the reference voltage comparison circuit 24, to serve as the secondary side circuit.

Accordingly, the present invention uses more than two circuit boards to implement the three-dimensional assembly, so as to improve the shortcoming that the conventional single plate of the circuit board will take a large area due to the insulation spacing between the primary side and the secondary side circuits, further allowing the circuit boards and the electronic elements of the three-dimensional power supply to be emplaced in a miniaturized container below the LED illumination module, and complying with the ITE regulation of a safe spacing.

It is of course to be understood that the embodiments described herein is merely illustrative of the principles of the invention and that a wide variety of modifications thereto may be effected by persons skilled in the art without departing from the spirit and scope of the invention as set forth in the following claims.

What is claimed is:

1. A three-dimensional miniaturized power supply comprising at least a first circuit board comprising one of a primary side circuit and a secondary side circuit and a second circuit board comprising the other of the primary side circuit and the secondary side circuit which are assembled in a chamber of a container at a bottom end of an LED illumination module in a three-dimensional spatial form, wherein an insulation spacing, which is in compliance with an ITE safety regulation, is provided between the first circuit board and the second circuit board.

2. The three-dimensional miniaturized power supply according to claim 1, wherein the first circuit board is configured as a primary side circuit board including a power input circuit, a voltage controller, and a pulse switch circuit; and the second circuit board being a safe low voltage secondary side circuit board including a rectifier circuit, a power output circuit, a photo coupler circuit, and a reference voltage comparison circuit, with an output end of the photo coupler circuit being connected with the pulse switch circuit, and an output end of the voltage controller being connected at the rectifier circuit.

3. The three-dimensional miniaturized power supply according to claim 1, wherein in addition to the first circuit board and the second circuit board, a third circuit board is added, allowing the first circuit board, the second circuit board, and the third circuit board to be assembled in the chamber of the container at the bottom end of the LED illumination module, in a three-dimensional spatial form, wherein an insulation spacing, which is in compliance with an ITE safe regulation, is provided between a circuit of the first circuit board and a circuit of the second circuit board.

4. The three-dimensional miniaturized power supply according to claim 1, wherein a bottom of the secondary circuit board is connected on a surface of the first circuit board and an insulation spacing of at least 6.4 mm is provided between the primary side and the secondary side circuits.

5. The three-dimensional miniaturized power supply according to claim 1, wherein more than two of the first and second circuit boards are parallel connected in the chamber through vertically installing an insulation fixing rack in the chamber of the container; an insulation spacing, which is designed in compliance with an ITE safe regulation and is at least 6.4 mm, being provided between the first and second circuit boards.

6. The three-dimensional miniaturized power supply according to claim 1, wherein the container is provided with the chamber within which are disposed with two through-holes; the first, second, and a third circuit boards being emplaced in the chamber, with a surface of the horizontal first circuit board being installed respectively with the second circuit board and the third circuit board; lower wires S1, S2 of the third circuit board being penetrated out of the through-holes respectively, to serve as input wires of an AC power; upper wires S3, S4 of the second circuit board being extended out of a mouth above the chamber respectively, to serve as output wires of the power supply.

7. The three-dimensional miniaturized power supply according to claim 1, wherein an interior of the container is provided with the chamber, with a height being between 18 mm and 58 mm, and a minimum inner diameter being between 12 mm and 50.8 mm.

8. The three-dimensional miniaturized power supply according to claim 1, wherein at least one insulation sheet is provided in a space between the first and second circuit boards.

9. The three-dimensional miniaturized power supply according to claim 1, wherein a bottom end of the container is provided with a spiral-shape power connector.

10. The three-dimensional miniaturized power supply according to claim 3, wherein the container is provided with the chamber within which are disposed with two through-holes; lower wires of the first circuit board being penetrated out of the through-holes respectively, to serve as input wires of an AC power; two wires of the second circuit board being extended out of a mouth above the chamber respectively, to serve as output wires of the power supply; and two wires connected at an input end of the third circuit board being penetrated out of the through-holes of the chamber respectively, to serve as power input wires.

11. The three-dimensional miniaturized power supply according to claim 3, wherein the first circuit board comprises the primary side circuit, a surface of which is installed respectively with a voltage controller and a pulse switch circuit; the second circuit board comprises the secondary side circuit, a surface of which being installed with a rectifier circuit; and a surface of the third circuit board comprises a power input circuit.

* * * * *